United States Patent [19]
Fujii

[11] Patent Number: 5,793,251
[45] Date of Patent: Aug. 11, 1998

[54] DEMODULATOR CIRCUIT USING GYRATOR CIRCUIT

[75] Inventor: Tomohiro Fujii, Tokyo, Japan

[73] Assignee: NEC Corporation, Tokyo, Japan

[21] Appl. No.: 760,373

[22] Filed: Dec. 4, 1996

[30] Foreign Application Priority Data

Dec. 8, 1995 [JP] Japan ................................. 7-345867

[51] Int. Cl.[6] .............................. H03D 3/06; H03H 11/50
[52] U.S. Cl. ......................... 329/337; 333/215; 455/214; 455/337
[58] Field of Search ........................ 329/337; 333/215; 455/214, 337

[56] References Cited

U.S. PATENT DOCUMENTS 4,963,831  10/1990  Stuivenwold et al. .................. 329/318

FOREIGN PATENT DOCUMENTS

| A0291826 | 11/1988 | European Pat. Off. . |
| A2634352 | 2/1978 | Germany . |
| 1-208011 | 8/1989 | Japan . |
| WO89/00791 | 1/1989 | WIPO . |
| WO93/20623 | 10/1993 | WIPO . |

OTHER PUBLICATIONS

D. Calder, "Audio Frequency Gyrator Filters for an Integrated Radio Paging Receiver," Mobile Radio Systems and Techniques, 10–13 Sep. 1984, 10 Sep. 1984, Institute of Electrical Engineers, pp. 21–26.

Patent Abstracts of Japan, Abstract of JP 1-208011, Aug. 22, 1989.

Schaum's Outline of Theory and Problems of Electric Circuits in Si Units, p. 94, paragraph 8.19, 1972, McGraw–Hill Book Company, N.Y. USA.

*Primary Examiner*—Siegfried H. Grimm
*Attorney, Agent, or Firm*—Sughrue, Mion, Zinn, Macpeak & Seas, PLLC

[57] ABSTRACT

A demodulator circuit includes a gyrator circuit forming a derived equivalent inductance which is used in a demodulating circuit. The gyrator circuit has a first operational transconductance amplifier and a second operational transconductance amplifier, wherein a second input terminal of the first operational transconductance amplifier is connected to a first output terminal of the second operational transconductance amplifier. A second output terminal of the first operational transconductance amplifier is connected to a second input terminal of the second operational transconductance amplifier. Both of the second input terminal of the first operational transconductance amplifier and the second input terminal of the second operational transconductance amplifier are grounded via a constant dc voltage. A first output terminal of the first operational transconductance amplifier is connected to a first input terminal of the second operational transconductance amplifier. A capacitor is connected between the first and second output terminals of the first operational transconductance amplifier. A first input terminal of the first operational transconductance amplifier serves as an input terminal to the gyrator circuit. The capacitance C of the capacitor is determined so that $C=LG^2$, where L stands for the desired equivalent inductance of the gyrator circuit as viewed from the input terminal thereof and G stands for the transconductance of each of the operational transconductance amplifiers employed in the gyrator circuit.

3 Claims, 10 Drawing Sheets

5,793,251

DEMODULATOR CIRCUIT USING GYRATOR CIRCUIT

BACKGROUND OF THE INVENTION

The present invention relates to a demodulator circuit, particularly to a demodulator circuit using gyrator circuits.

As a method of demodulation employed in a radio receiver, differentially coherent detection, pulse count detection or quadrature detection has been conventionally employed. Among these schemes of detection, the quadrature detection using a resonator element has been adopted in vogue in recent radio receivers.

One of the reasons for the quadrature detection being widely used is that a ceramic discriminator (hereinafter, referred to as a discriminator) of high precision and high stability is readily accessible for a resonator element.

In most cases, a demodulating integrated circuit, i.e., an intermediate-frequency IC (hereinafter, referred to as IFIC) is arranged in a demodulating part in the interior of the radio receiver, and the resonator element such as the discriminator is installed externally of the receiver.

A resonance frequency of a discriminator, however, is unavoidably fixed when the discriminator is used as an externally installed resonator element.

This gives a rise to the problem that the discriminator has to be changed depending on the IF frequency concerned. Furthermore, since a discriminator is normally required to couple with IFIC under the condition of impedance match, another problem has been that a large amount of operation, time and cost is required for adjusting the parameters of the discriminator with respect to those of the IFIC every time the discriminator is changed.

Similar problems have been present in the case of an LC circuit used for a resonator element.

Use of a conventional LC circuit in a demodulator circuit suffers from a further problem that the freedom to modify the characteristics of the LC resonance circuit is limited because of the limited number of the parameters which influence on the characteristics. In addition, a large volume of the LC resonance circuit causes another problem in installation of the resonance circuit.

Recently, a variety of attempts have been made to incorporate a resonance circuit in the interior of an IC in view of the above-described problems.

As a method of providing an inductance of a resonance circuit in the interior of the IC, the method has been reported by many authors in which a gyrator circuit equivalent to a desired inductance is employed.

An example of a grounded inductance circuit using a gyrator circuit of prior art is described in Japanese Patent Laid-open Hei 1-208011.

FIG. 1 shows a block diagram of an ac-equivalent circuit of a gyrator circuit of prior art.

As is shown in the figure, the gyrator circuit is made up of first and second operational transconductance amplifiers, OTA 1 and OTA 2, with first and second differential output terminals of OTA 1 connected to first and second differential input terminals of OTA 2, respectively, and with first and second differential output terminals of OTA 2 cross-connected to second and first differential input terminals of OTA 1, respectively. In addition, a capacitor $C_1$ is connected between the differential output terminals of OTA 1.

In FIG. 1, I' and V' denote ac components of a current I and a voltage V, respectively.

The ac current $I_1$, flows through the current path in OTA 2 the conductance of which is controlled by the base voltage $V_2$, of OTA 2 produced across capacitor $C_1$.

Accordingly, it follows that $$I_1 = G_2 V_{2'} \tag{1}$$

wherein $G_2$ stands for the transconductance of OTA 2. Similarly, $$-I_2 = G_1 V_{1'} \tag{2}$$

wherein $G_1$ stands for the transconductance of OTA 1.

Substituting $V_{2'}$ with $-I_{2'}/(jC_1\omega)$ and eliminating $I_{2'}$ from equations (1) and (2) yield $$V'_1/I'_1 = j\omega[C_1/(G_1 G_2)] \tag{3}$$

Putting $$L = C_1/(G_1 G_2) \tag{4}$$

gives $$Z_{input} = V_1/I_1 \tag{5}$$
$$= jL\omega.$$

FIG. 2 shows a detailed circuit diagram of a demodulator circuit using a prior art gyrator circuit described above.

In FIG. 2, OTA 1 is made up of differential transistors (Q12, Q15) and (Q13, Q14), current source transistors Q8 and Q9, Q8 being connected to the emitters of differential transistors (Q12, Q15) and Q9 being connected to the emitters of differential transistors (Q13, Q14), and load transistors Q21 and Q22.

This dual structure of two differential amplifiers is intended for extending the dynamic range of the OTA.

OTA 2 has the same circuit structure as OTA 1, and is made up of differential transistors (Q16, Q19) and (Q17, Q18), current source transistors Q10 and Q11 and load transistors Q23 and Q24.

In OTA 1 and OTA 2 of FIG. 2, a first differential input of OTA 1 (the bases of transistor Q12 and Q13) is connected to a second differential output of OTA 2 (the collectors of transistors Q18 and Q19), and a second differential input of OTA 1 (the bases of transistor Q14 and Q15) is connected to a first differential output of OTA 2 (the collectors of transistors Q16 and Q17).

A first differential input of OTA 2 (the bases of transistor Q18 and Q19) is connected to a first differential output of OTA 1 (the collectors of transistors Q14 and Q15), and a second differential input of OTA 2 (the bases of transistor Q16 and Q17) is connected to a second differential output of OTA 1 (the collectors of transistors Q12 and Q13).

Capacitor C1 is connected between the first and second output of OTA 1.

In the gyrator circuit shown in FIG. 2, the second input of OTA 1 (the bases transistors Q14 and Q15) is ac-grounded via dc supply V4.

Thus, the circuitry of the gyrator circuit shown in FIG. 2 agrees with that shown in FIG. 1.

A stabilized current supply SCS is provided for supplying constant currents $I_g$ through current mirror circuits to the current sources made up of NPN transistors Q8, Q9 of OTA 1 and NPN transistors Q10, Q11 of OTA2, and for supplying constant currents $I_g$ to the PNP load transistors Q21, Q22 of OTA1 and Q23, Q24 of OTA2.

The stabilized current supply SCS is made up of serially connected PNP and NPN transistors, Q3, Q1, respectively, serially connected PNP and NPN transistors, Q4, Q2, respectively, dc voltage source V1, and a current-regulating register R5.

The emitter of transistor Q3 is connected to a positive electrode of dc voltage source V1, and the emitter of transistor Q1 is connected to the grounded negative electrode of the dc voltage source V1, thereby making up a current generating circuit. Transistor Q1 is diode connected, the base of which is connected to the base of transistor Q2 to constitute a current mirror circuit.

The serially connected transistors Q2 and Q4 make up an output circuit of the current mirror circuit with the diode-connected transistor Q4 acting as a load transistor. The collector of the load transistor Q4 is connected to the base of the transistor Q3 to form a negative-feedback signal path to stabilize the current $I_g$ flowing through the collectors of transistors Q2 and Q4. The current intensity is determined depending on the value of the resistor R5.

The base line connected with the bases of transistor Q1 and Q2 is connected to the bases of transistors Q8, Q9, Q10 and Q11 to form a current mirror circuit to transfer the current $I_g$ to the current-source transistors (Q8, Q9, Q10, Q11) of OTA 1 and OTA 2.

The base line connected with the bases of transistors Q3 and Q4 is connected to the bases of the transistors Q21, Q22, Q23 and Q24 to form another current mirror circuit for transferring the current $I_g$ to the current load transistors (Q21, Q22, Q23, Q24) of OTA 1 and OTA 2.

The demodulating circuit is essentially made up of a bridge circuit as is shown in FIG. 3 with resistors R1 and R2 in first and second arms, respectively, resistor R3 in a third arm and an impedance circuit in a fourth arm which is made up of the inductor L equivalent to the gyrator circuit described above, capacitor C3 serially connected to the equivalent inductor L, and capacitor C2 connected in parallel to the equivalent inductor L. Resistance R4 depicted in FIG. 2 as connected in series to capacitor C3 is not an actual resistor but an equivalent resistance corresponding to the Q factor of the resonance circuit.

In this resonance circuit, the serial resonance frequency $f_s$ and the parallel resonance frequency $f_p$ are given by the equations $$f_s = [2\pi(LC)^{1/2}]^{-1} \quad (6)$$

$$f_p = f_s \times [(1+(C2/C3)]^{1/2} \quad (7)$$

Since our present interest is directed to the frequency range between $f_s$ and $f_p$ where the resonance circuit is inductive, we will limit our argument to the case that the fourth arm is inductive.

The output of the bridge circuit is amplified by the differential amplifier (cf. FIG. 2) made up of transistors Q32, Q33, load resistors R9, R10, operating voltage source V3 and constant current supplies I1, I2.

In order to apply a desired base bias voltage to the base of transistor Q32, the alternating input V5 is biased by dc voltage V2. Similarly, a desired base bias voltage for transistor Q33 is provided by connecting resistor R3 between operating voltage source V3 and constant current source I2.

The output of the differential amplifier is supplied to EX-NOR gate 10, the output of which is integrated by integrator 12 to produce the demodulated signal.

Now the operation of the demodulating circuit described above will be set forth with reference to FIG. 4 and FIG. 5.

FIG. 4 is a vector diagram representing the phases of the voltages across the arms of the bridge circuit shown in FIG. 3, and FIG. 5 is a diagram to illustrate the operations of EX-NOR gate 10 and integrator 12.

In FIG. 4, the voltages across resistors R2 and R3, which are in phase with input signal V5, are depicted in the direction of the real axis. Since the phase of the voltage induced in the inductor L (the voltage across reactance $jL\omega$) makes a right angle with the phase of the voltage across resistor R1, the potential at point a moves along the perimeter of the semicircle having a diameter of the line segment dc, depending on the frequency $\omega$.

In FIG. 4, the angle θ which corresponds to the phase difference of the potentials at nodes a and b (the phase of the difference vectors between vectors da and db) decreased as frequency $\omega$ increases.

FIGS. 5 (A),(B) and (C) represent the time charts A, B of a signal in phase with input signal V5 and the output of the bridge circuit shown in FIG. 3, respectively, and the time chart Y of the output of EX-NOR gate 10.

FIG. 5 (D) represents the output of integrator 12 in voltage versus frequency.

In each of FIGS. 5, (A), (B) and (C), time chart A represents the output voltage at node b of FIGS. 2 and 3 which is in phase with input signal V5, and time chart B corresponds to the output voltage at node a which is out of phase with respect to input signal V5 depending on the frequency $\omega$, as described above with reference to FIG. 4.

FIG. 5, (A), (B) and (C) represent the cases in which phase difference θ between the outputs at nodes a and b is relatively large ($\theta_1$), intermediate ($\theta_2$) and small ($\theta_3$). The curve Y (the output of EX-NOR 10) represents the duration in which curves A and B stay in phase.

Since the phase difference θ decreases with increasing $\omega$, as described above with reference to FIG. 4, the output voltage of integrator 12 increases as frequency $\omega$ increases, as shown in FIG. 5, (D).

FIG. 6 represents a temperature dependence of the impedance Z of the LC resonance circuit shown in FIG. 2 plotted against frequency.

The figure shows that the temperature variation from $-10°$ C. to 50° C. causes a shift of the impedance characteristic by 30K Hz, i.e., ±15 KHz with respect to the center frequency of 450 KHz.

This undesirable shift of the impedance entails a fluctuation of the resonance frequency by ±15 KHz for the same temperature variation.

The frequency variation versus temperature variation of an ordinary resonance circuit in which a ceramic element is employed as a capacitor element is approximately ±1.5 KHz for the above-described range of temperature variation.

For this reason, the temperature dependence of the resonance circuit utilizing the prior art gyrator circuit is ten times as large as that of an ordinary resonance circuit.

In FIG. 2, the dc biases which exert significant effects on the operation of the gyrator circuit are entered, wherein the biases are simulated values by means of the circuit simulator of Spice et al. The simulation was implemented under the following conditions: temperature 25° C.; series resonance frequency 410 KHz; parallel resonance frequency 490 KHz; center frequency 450 KHz; the impedance 11 KΩ at 450 KHz; the voltage of dc voltage source V1 1.05V; and ac ground potential 862 mV. In addition, the simulation is performed assuming that the temperature characteristics of the dc voltage source V1 and the ac-ground potential are the same as the temperature characteristic of $V_{BE}$ of transistors used, whereby to take the temperature characteristic of the $V_{BE}$ out of consideration.

From the result of the simulation above, it is known that the biases of input and output terminals of the OTAs significantly deviate from their normal values, causing the transistors to saturate and thereby interrupting the transistors normally to work. Furthermore, it is known that the phase of the impedance of the resonance circuit of FIG. 2 is approximately 37 degrees in contrast to the normal value of 90 degrees.

It is an object of the present invention to provide a demodulator circuit with an LC resonance circuit utilizing a gyrator circuit of a stable frequency characteristic, in which the dc biases will not deviate from the normal values and the resonance frequency of the resonance circuit will not be influenced by a temperature variation.

SUMMARY OF THE INVENTION

In order to attain of the above-described object of the present invention, the demodulator circuit according to the present invention comprises a gyrator circuit and a demodulating circuit.

Of these circuits, the demodulator circuit of the present invention is characterized by the gyrator circuit.

The gyrator circuit is made up of a first OTA (operational transconductance amplifier) and a second OTA.

The gyrator circuit is structured such that a second input terminal of the first, OTA is connected to a first output terminal of the second OTA, a second output terminal of the first OTA is connected to a second input terminal of the second OTA, and both the second input terminal of the first OTA and the second input terminal of the second OTA are ac-grounded, i.e., grounded via a constant dc voltage. A first output terminal of the first OTA is connected to a first input terminal of the second OTA, and a capacitor is connected between the first and second output terminals of the first OTA.

In this gyrator circuit, a first input terminal of the first OTA acts as an input terminal to the gyrator circuit.

The ac-grounding via the same dc voltage of the second input terminals of both the first and second OTAs causes other biases of the two OTAs to be substantially equal.

Since two equal biases in the transistors of the OTAs cause an equal transconductance G, the capacity C of the capacitor is determined so that $$C=LG^2, \qquad (8)$$

where L stands for a desired equivalent inductance of the gyrator circuit as viewed from the input terminal of the gyrator circuit.

Since two equally biased OTAs perform balanced operations, saturation of the transistors used in the OTAs can be avoided.

Furthermore, equally biased OTAs have an equal transconductance characteristic. This offers the advantage that temperature compensation of one of the OTAs, if performed appropriately, will involve temperature compensation of the other of the OTAs at the same time.

A preferable OTA includes a differential amplifier of a dual structure, or a dual differential amplifier. The dual differential amplifier has first and second differential amplifiers each of which has differential transistors of a first conduction type.

The emitters of said differential transistors of each differential amplifier are connected together to a collector of a current-source transistor of the first conduction type, a first of the differential transistors in the first differential amplifier has a base and a collector connected with a base and a collector, respectively, of a first of the differential transistors in the second differential amplifier.

The connected bases act as the first input of the OTA and the connected collectors are connected with a first load transistor of the second conduction type to act as the second output of the OTA.

A second of the differential transistors in the first differential amplifier has a base and a collector connected with a base and a collector, respectively, of a second of the differential transistors in the second differential amplifier, the connected bases of the second differential transistors in both of the differential amplifiers act as the second input of the OTA and the connected collectors of the second differential transistors in both of the differential amplifiers are connected to a second load transistor of the second conduction type to act as the first output of the OTA.

The reason for the OTA of this circuit structure being opted for is that the temperature dependence of the transconductance of this type of OTA can easily be canceled by the temperature dependence of the current output of the stabilized current supply means described below.

The stabilized current supply means comprises:

a first transistor of a first conduction type, and a second transistor of a second conduction type serially connected to said first transistor, a third transistor of said first conduction type, and a fourth transistor of said second conduction type serially connected to said third transistor, the emitter of said third transistor being connected to one end of a current-regulating resistor, said first transistor being diode-connected, the collector of the diode-connected first transistor being connected to the base of said third transistor, said fourth transistor being diode-connected, the collector of the diode-connected fourth transistor being connected to the base of said second transistor, the resistance of the resistor being determined so that an arbitrarily selected one of the operational transconductance amplifiers has an optimum transconductance for realizing an intended inductance of the gyrator circuit, and the collector current of said third and fourth transistors being transferred through a current mirror circuit to said current-source transistors of said operational transconductance amplifiers.

The temperature dependence of the transconductance G of the OTA structured as described above is given by the equation $$(1/G)(\delta G/\delta T)=(1/I_g)(\delta I_g/\delta T)-(1/V_T)(\delta V_T/\delta T), \qquad (9)$$

where $I_g$ is the dc current supplied by the stabilized current supply means and $V_T$ stands for thermal voltage of the transistor used in the circuit.

On the other hand, the temperature dependence of the output current of the stabilized current supply means is given by the equation $$(1/I_g)(\delta I_g/\delta T)=(1/V_T)(\delta V_T/\delta T). \qquad (10)$$

Substituting equation (10) into equation (9) yields $$\delta G/\delta T=0, \qquad (11)$$

representing that thermal variation of the transconductances in both of the OTAs is compensated for at the same time by the thermal variation of the output current of the stabilized current supply means.

The gyrator circuit of the present invention is further provided with a first transfer circuit and a second transfer circuit both for transferring a current produced by said stabilized current supply means to the OTAs, and a current amplifier circuit for stabilizing a current in said OTAs.

The first transfer circuit is made up of a fifth transistor of the second conduction type with a base connected to the base of said fourth transistor and a diode-connected sixth transistor of the first conduction type.

The current generated in the stabilized current supply means is transferred to the first transfer circuit via the current mirror circuit made up of the fourth and fifth transistors.

The second transfer circuit is made up of seventh transistor of the first conduction type with a base connected to the base of the diode-connected sixth transistor and also with a first base line connecting the bases of said current-source transistors in said OTAs, and eighth transistor of the second conduction type with a base connected to a second base line connecting the bases of said load transistors of said OTAs.

The current transferred from the stabilized current supply means to the first transfer circuit is transferred to the second transfer circuit via the current mirror circuit made up of the sixth and seventh transistors and in turn transferred to the current-source transistors of the OTAs via the current mirror circuit made up of the seventh transistor and said current-source transistors.

The current transferred to the second transfer circuit is transferred to the load transistors in the OTAs via the current mirror circuit made up of the eighth transistor and the load transistors.

The current amplifier circuit comprises a differential amplifier made up of a first transistor and a second transistor of the first conduction type with the emitters of both transistors coupled to an regulated current supply, said first transistor having a base coupled to a reference voltage and a collector connected to a collector of a first load transistor of the second conduction type to provide an output of the differential amplifier, and said second transistor having a base connected to the collector of said eighth transistor to provide a negative feedback path, and also having a collector connected to a diode-connected second load transistor of the second conduction type, the collector of the second load transistor connected to the base of the first load transistor to provide a negative feedback path for stabilizing the differential amplifier, an phase compensating circuit connected between said output of the differential amplifier and the collector of the eighth transistor to prevent undesirable oscillation of the gyrator circuit, and said output of the differential amplifier being connected to the base of the eighth transistor.

The current amplifier basically acts as a voltage follower with a current amplifier (the eighth transistor) in the feedback signal path.

When a current in the OTA increases for some reason causing the potential of the second base line to drop, the collector current of the eighth transistor increases.

This causes the base current of the second transistor of the differential amplifier to increase and results in a rise of the output potential of the differential amplifier, thereby causing the base potential of the eighth transistor to rise and the current in the OTA to decrease. In this way, the current in the gyrator circuit is stabilized.

The above and other objects, features and advantages of the present invention will become apparent from the following description referring to the accompanying drawings which illustrate an example of a preferred embodiment of the present invention.

DETAILED EXPLANATION OF THE PREFERRED EMBODIMENT

Figure 7:
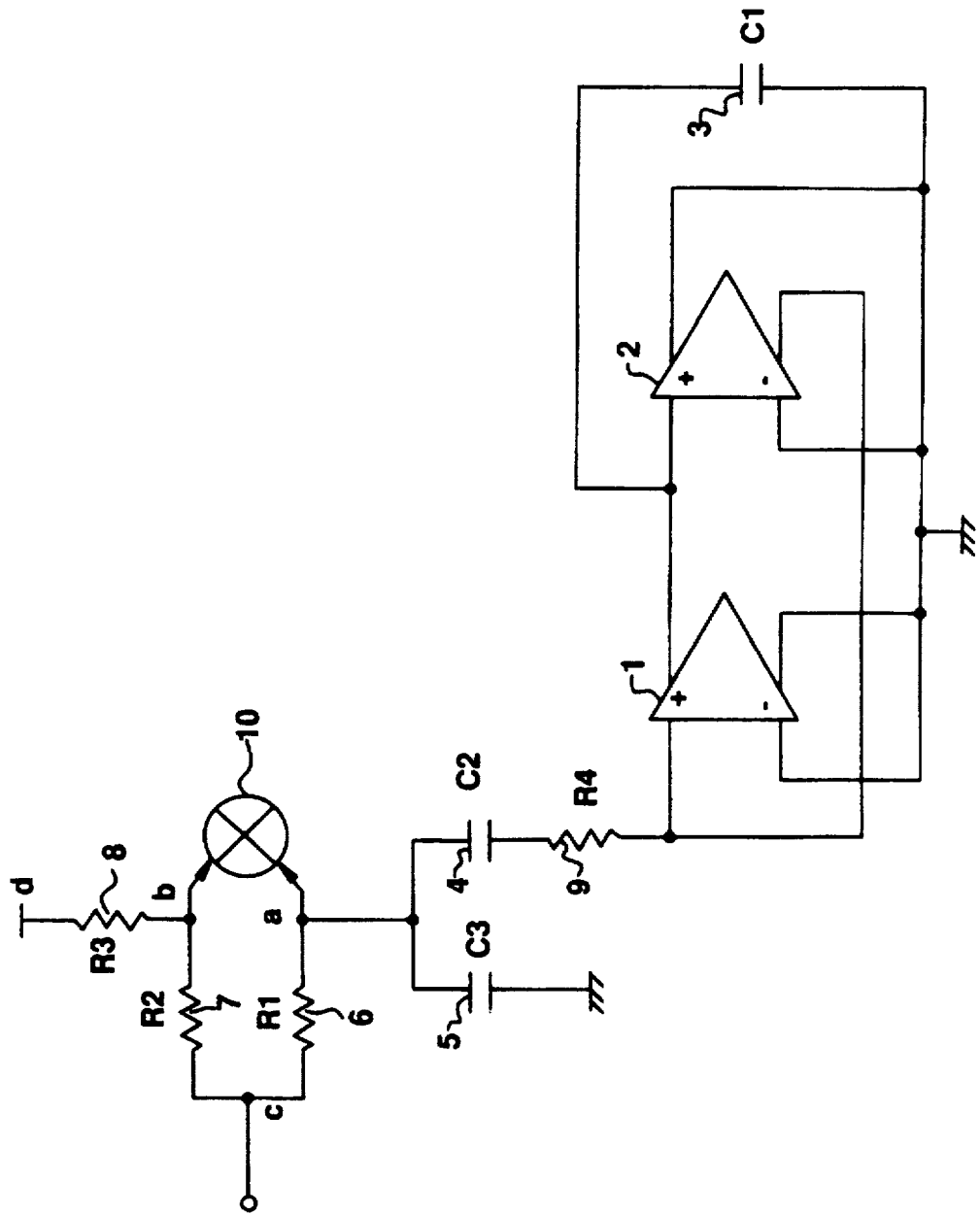
FIG. 7 is a diagram to illustrate the principle of the present invention.

FIG. 7 is a diagram to illustrate the principle of the present invention.

Figure 8:
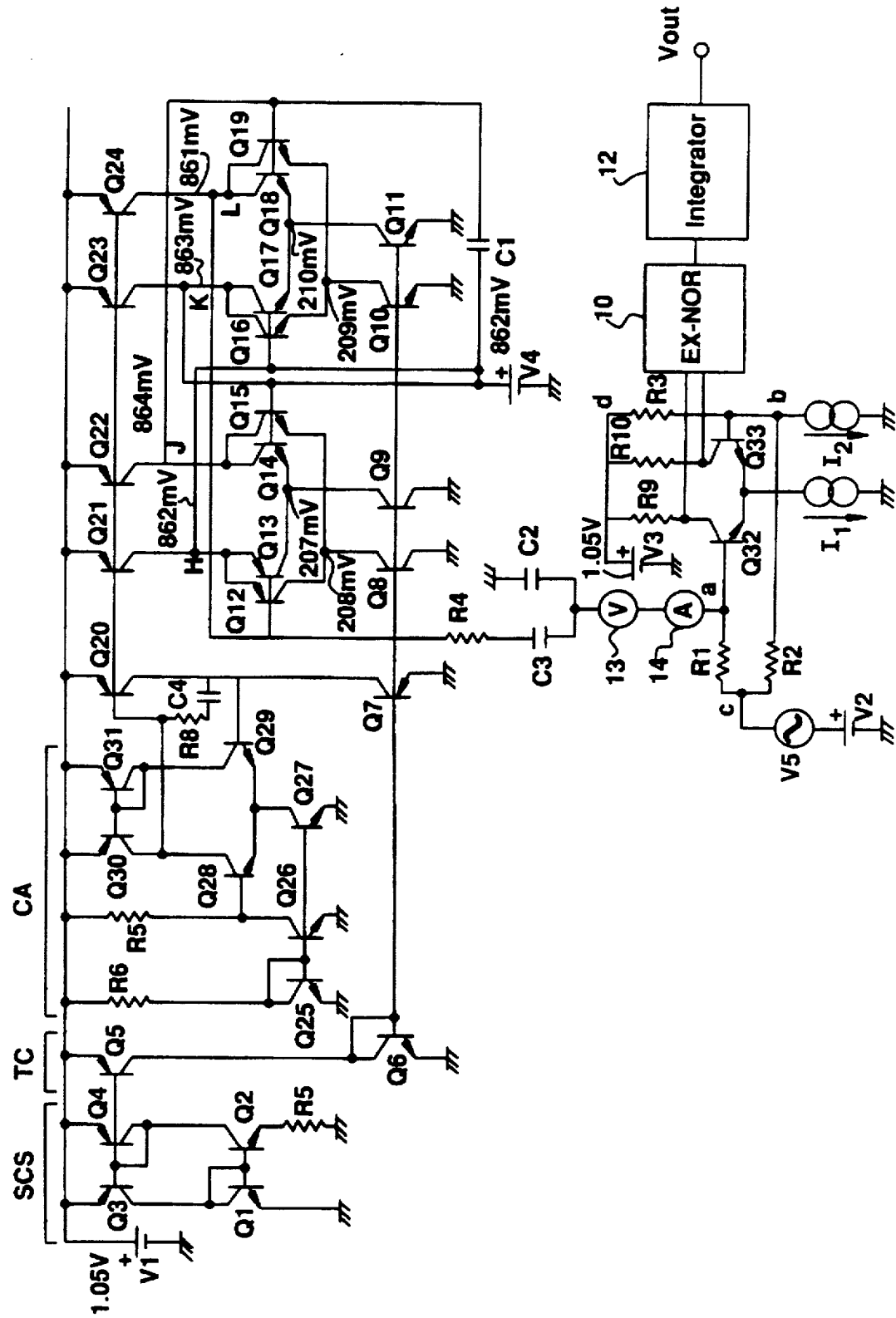
FIG. 8 shows a detailed circuit diagram of a demodulator circuit using the gyrator circuit shown in FIG. 7.

FIG. 8 shows a detailed circuit diagram of a demodulator circuit using the gyrator circuit shown in FIG. 7.

The demodulator circuit is basically constituted by a bridge circuit made up of resistor R1 as a first arm, resistor R2 as a second arm, resistor R3 as a third arm and an impedance circuit as a fourth arm.

The impedance circuit is made up of a parallel resonance capacitor 5 with capacity C3, serial resonance capacitor 4 with capacity C2 and a gyrator circuit with equivalent inductance L connected in series to capacitor 4. Resistor 9 of a magnitude R4 corresponds to a Q number of the resonance circuit as described above with reference to FIG. 2. The output of the bridge circuit is applied to EX-NOR gate 10.

Figure 1:
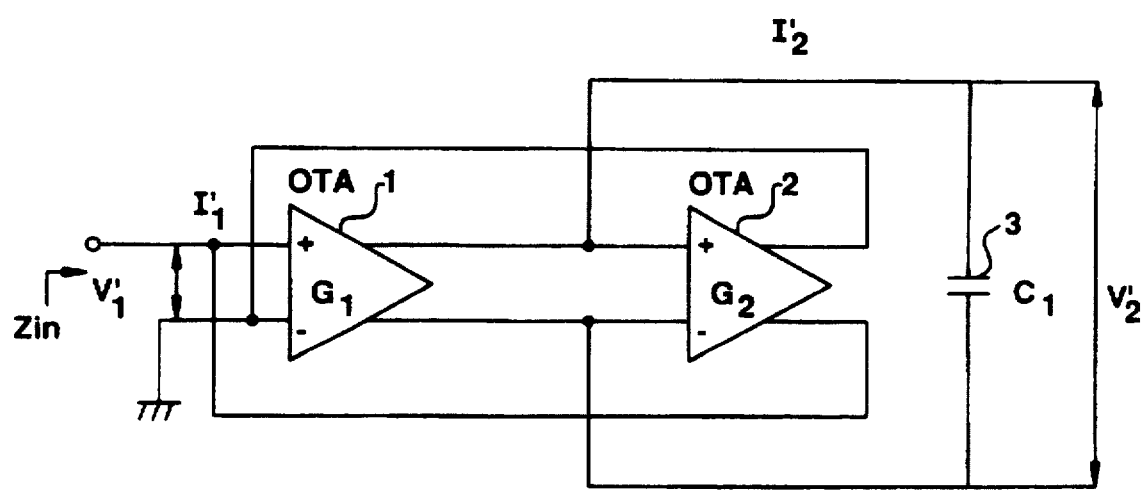
FIG. 1 shows a block diagram of an ac-equivalent circuit of a gyrator circuit of prior art.
Figure 2:
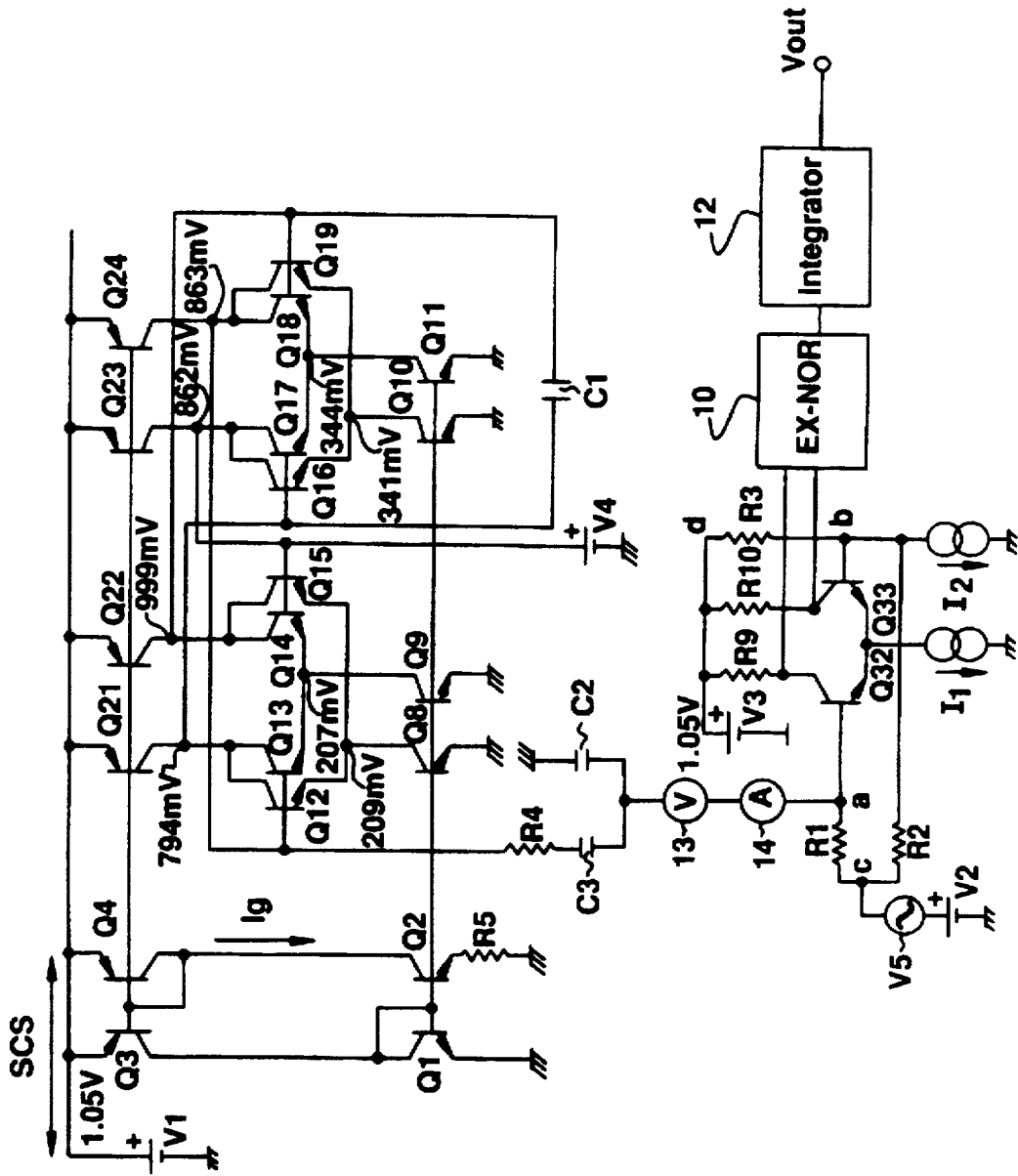
FIG. 2 shows a detailed circuit diagram of a demodulator circuit using a prior art gyrator circuit shown in FIG. 1.
Figure 3:
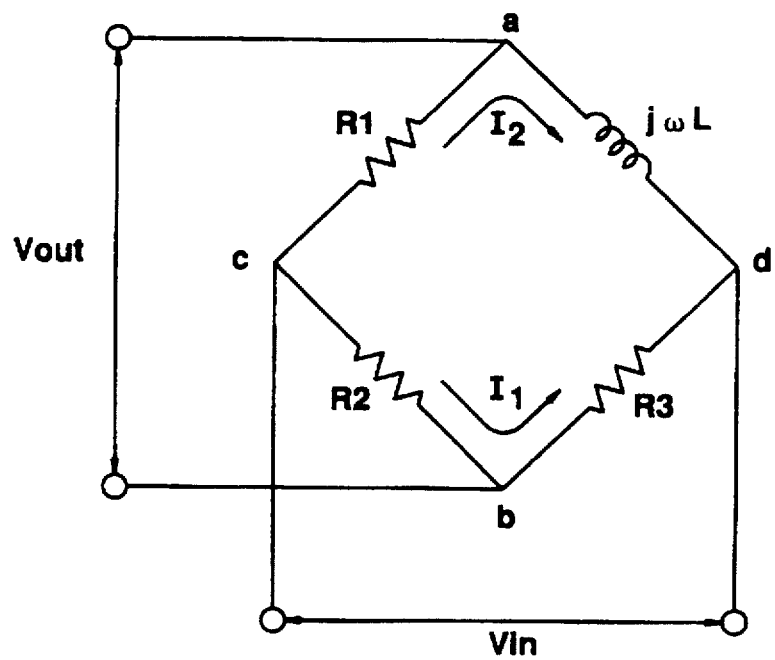
FIG. 3 represents a bridge circuit equivalent to the demodulating circuit shown in FIG. 2.
Figure 4:
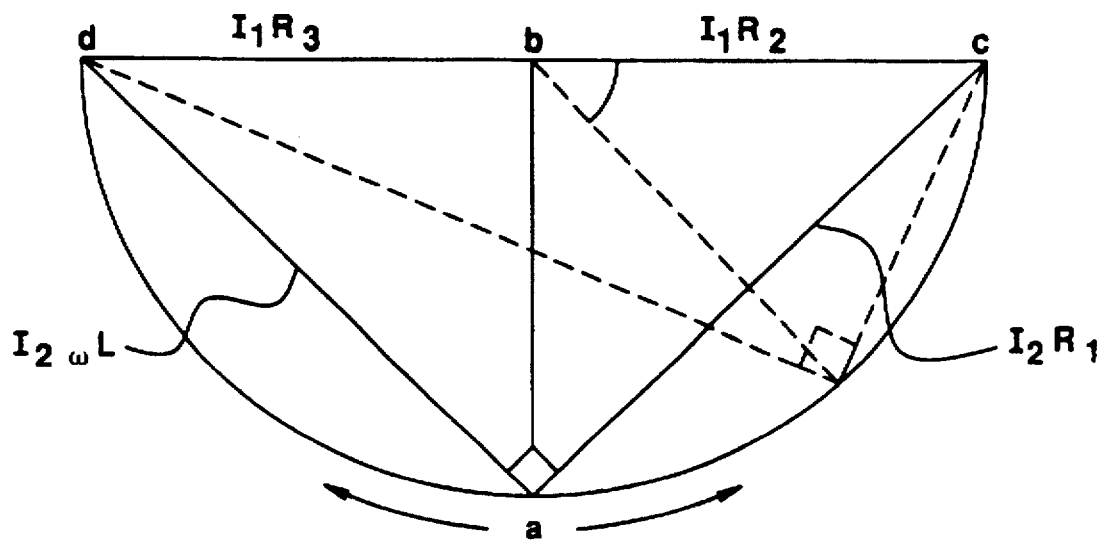
FIG. 4 is a vector diagram representing the phases of the voltages across the arms of the bridge circuit shown in FIG. 3.
Figure 5A:
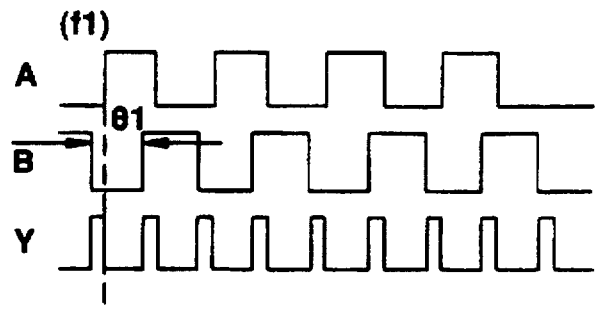
FIG. 5 is a diagram to illustrate the operations of EX-NOR gate and integrator.
Figure 5B:
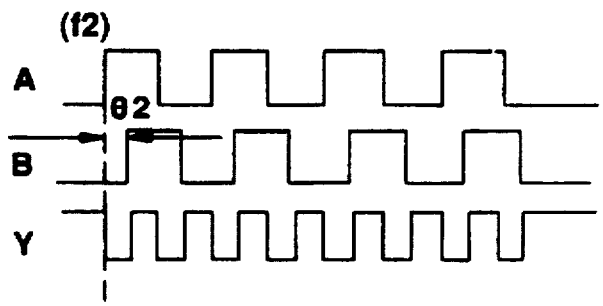
Figure 5C:
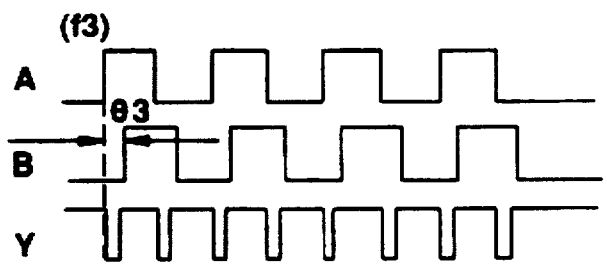
Figure 5D:
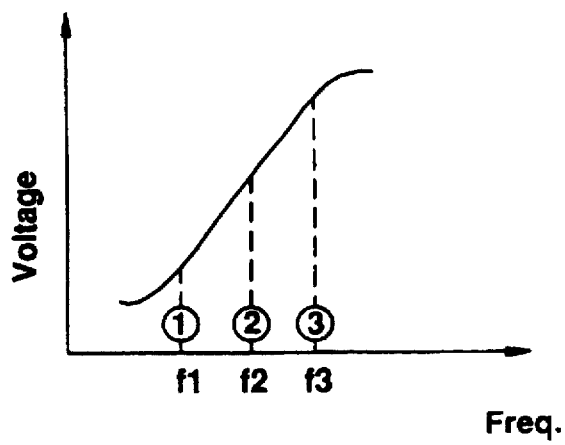
Figure 6:
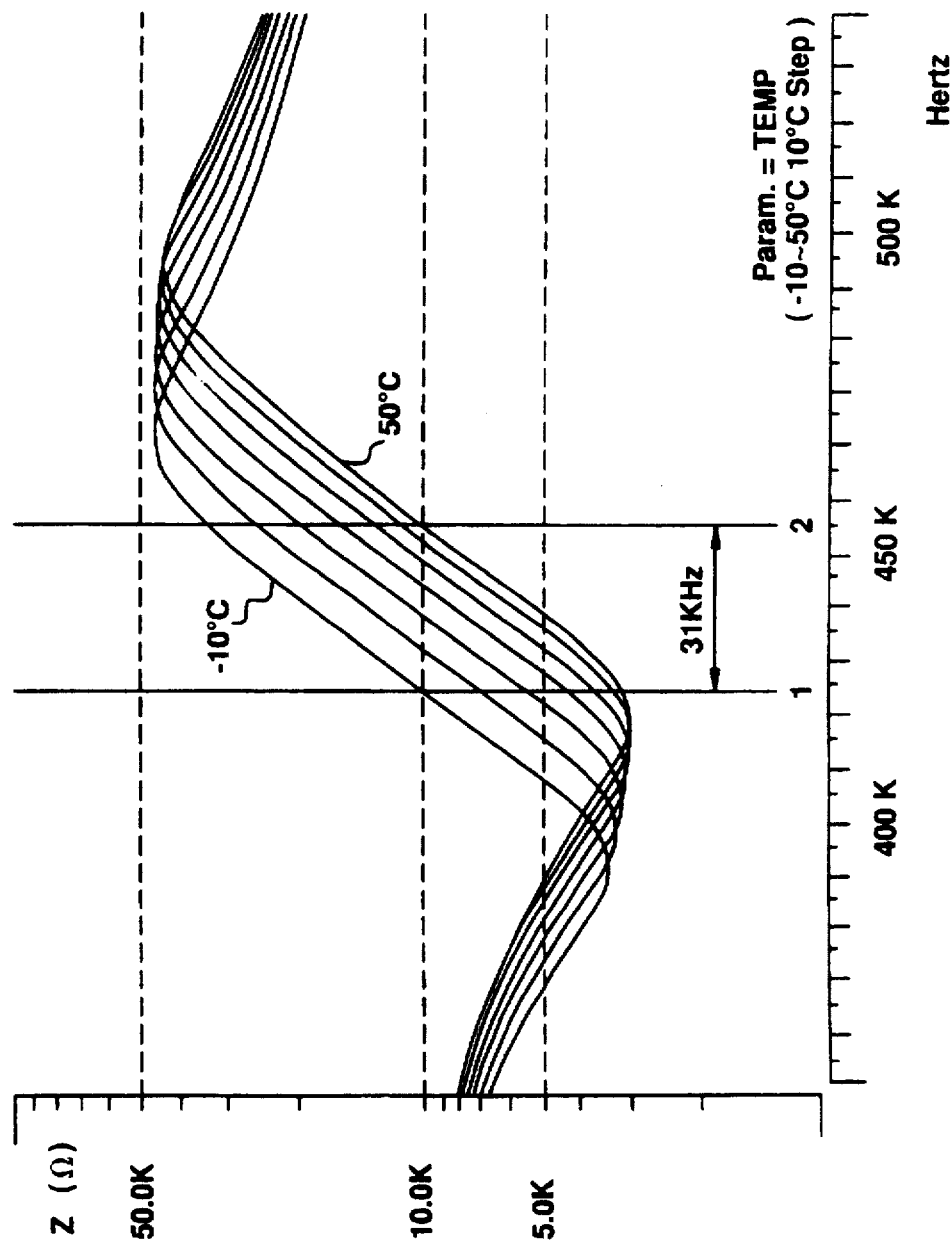
FIG. 6 represents a temperature dependence of the impedance of the LC resonance circuit shown in FIG. 2 plotted against frequency.

The demodulator circuit according to the present invention differs from the demodulator circuit of the prior art shown in FIGS. 1 and 2 in that both the second output of OTA 1 (the collectors of transistors Q12 and Q13) and the second input of OTA 2 (the bases of transistors Q16 and Q17) are ac-grounded, i.e., grounded via the same constant dc voltage V4 as the second input of OTA 1 (the bases of transistors Q14 and Q15) and thus as the first output of OTA 2 (the collectors of transistors Q16 and Q17).

This circuitry allows the second inputs of OTA 1 and OTA 2 to be biased at the same voltage and also allows the second output of OTA 1 and the first output of OTA 2 to be biased at the same voltage, thereby causing OTA 1 and OTA 2 to have an equal transconductance ($G_1=G_2=G$). Hereinafter, the circuitry described above will be referred to as equal-bias circuitry in order to discriminate the circuitry of the gyrator circuit of the present invention from that of the prior art gyrator circuit described with reference to FIG. 2.

In FIG. 8, main dc biases are entered which are simulated by means of the circuit simulator of Spice et al. The simulation was implemented under the following conditions: temperature 25° C.; series resonance frequency 410 KHz; parallel resonance frequency 490 KHz; center frequency 450 KHz; input impedance approximately 12 KΩ at 450 KHz; tension of dc voltage source VS2 1.05V; and ac ground potential 860 mV. In addition, the simulation is performed assuming that the temperature characteristics of the dc voltage source V1 and ac-ground potential V4 accord with the temperature characteristic of base-emitter voltages $V_{BE}$ of the employed transistors in order to take the temperature characteristic of the $V_{BE}$ of the transistor out of consideration.

From the result of the simulation above, it is known that the differences of the bias voltages of input and output terminals of the OTAs are as small as 3 mV which corresponds to a difference rate of ±0.35% with respect to the ac ground bias V1.

For comparison, in the prior art LC resonance circuit shown in FIG. 2 the differences of the bias voltages of input and output terminals of the OTAs are as large as 137 mV, or 16% expressed by the difference rate.

It is to be appreciated that the equal-bias circuitry obviates the transistors in OTA 1 and OTA 2 from being saturated and enables the OTAs to work normally.

It is further to be appreciated that the equal transconductance of OTA 1 and OTA 2 offers an advantage of easing temperature compensation of the gyrator circuit, provided that the OTAs are associated with a specified stabilized current source, as will be described below.

Another difference of the demodulator circuit shown in FIG. 8 from the demodulator circuit shown in FIG. 2 is that a current transfer circuit TC and a current amplifier circuit CA are provided between the stabilized current source SCS and the gyrator circuit.

Before proceeding to the method of temperature compensation, we will present explanations on the current transfer circuit and the current amplifier circuit.

The transfer circuit is made up of an NPN transistor Q6 and a PNP transistor Q5 serially connected to each other. Transistor Q6 is diode-connected, the base of which is connected to the base line of the current-source transistors of the OTAs. The base of transistor Q5 is connected to the bases of transistor Q3, Q4 to form a current mirror circuit.

In operation of transfer circuit TC, the corrector current of transistors Q4, Q2 is transferred to transfer circuit TC via the current mirror circuit made up of transistors Q2, Q4 and Q5. The corrector current of Q5, Q6 is transferred to OTA 1 and OTA 2 via the current mirror circuit made up of transistors Q5, Q6 and the base line of the current-source transistors of OTA 1 and OTA 2.

The current amplifier circuit CA comprises: current source circuit made up of NPN transistors Q25, Q26 and resistors R5, R6; differential amplifier made up of NPN transistors Q28, Q29, Q27, and PNP transistors Q30, Q31; and buffer circuit made up of an NPN transistor Q7, a PNP transistor Q20, and a feedback path made up of resistor R8 and capacitor C4.

Transistor Q25 is diode-connected to the base of which is connected to the base of transistor Q26. The current produced in the transistor Q25 is transferred to the current-source transistor Q27 of the differential amplifier via the current mirror circuit made up of resistor R6, transistor Q25 and transistor Q26.

The output of the current mirror circuit (the potential at the junction of resistor R5 and the collector of transistor Q26) is supplied to the base of one (Q28) of the differential gain transistors. The base of the other (Q29) of the differential gain transistors is connected with the output terminal of the buffer circuit (the junction of the collectors of transistors Q20 and Q7). Transistors Q30, Q31 act as the load transistors of the differential amplifier. One of the differential output terminals (the junction of transistors Q28 and Q30) is connected to the base of transistor Q20 and the base line which connects the bases of the load transistors Q21, Q22, Q23 and Q24 of OTA1 and OTA2. The serially connected resistor R8 and capacitor C4 serve to prevent an undesirable oscillation of the gyrator circuit.

Since negative feedback is effected through the signal path connecting between the base of transistor Q29 and the junction of the collectors of transistors Q7 and Q20, the potential to be applied to the base line of the load transistors Q21, Q22, Q23 and Q24 is stabilized, whereby the stabilized currents are supplied to the load transistors Q21, Q22, Q23 and Q24.

Furthermore, the base of transistor Q7 is connected with the base line which connects the base of transistor Q6 of transfer circuit TC and the bases of the current-source transistors Q8, Q9, Q10 and Q11 of OTAs in order to ensure the current supplied by each of the current-source transistors Q8, Q9, Q10 and Q11 to the OTA to equal the current which flows through each of the load transistors Q21, Q22, Q23 and Q24.

Next, in order to disclose a method of temperature compensation, we will express the transconductance of an OTA in an analytical form based on the theory of semiconductors.

Figure 9:
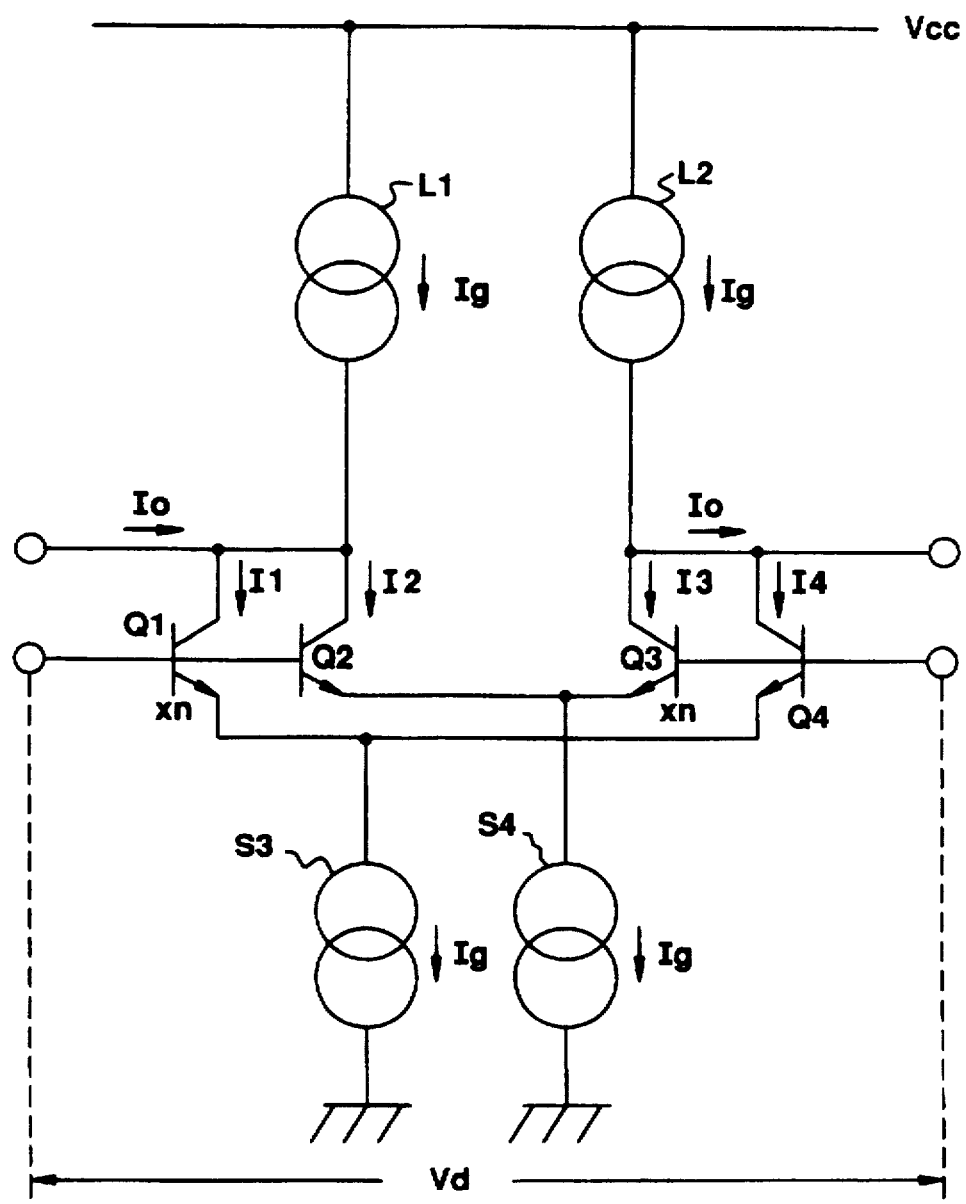
FIG. 9 is a circuit diagram of the OTA used in the gyrator circuit of the present invention.

FIG. 9 is a circuit diagram of the OTA used in the gyrator circuit of the present invention.

As is shown in the figure, each of the differential inputs is connected to the bases of a couple of NPN transistors (Q1,Q2), (Q3,Q4), wherein transistors Q1 and Q4 make up a differential amplifier and transistors Q2 and Q3 make up another differential amplifier.

In FIG. 9, the symbol xn stands for an emitter area n times as large as the emitter area of the transistor unlabeled with the symbol. The unlabeled transistors have the same emitter area as each other. The preferable value of n is 4.

The constant current source denoted by S3 supplies a current of $I_g$ to the emitters of transistors Q1,Q4 of the first differential amplifier, and the constant current source S4 supplies current of the same intensity $I_g$ to the emitters of transistors Q2,Q3 of the second differential amplifier. Through current loads L1 and L2, constant currents of the same intensity $I_g$ flow.

Now, let collector currents of transistors Q1, Q2, Q3 and Q4 be $I_1$, $I_2$, $I_3$ and $I_4$ respectively.

Then, $$I_1 + I_2 = I_g + I_o, \tag{12}$$

$$I_3 + I_4 = I_g - I_o, \tag{13}$$

$$I_g = I_1 + I_4, \tag{14}$$

$$= I_2 + I_3, \tag{14'}$$

$$I_1 = n \cdot I_e \exp[V_{BE1}/V_T], \tag{15}$$

$$I_2 = I_e \exp[V_{BE2}/V_T], \tag{15'}$$

-continued $$I_3 = n \cdot I_s \exp[V_{BE3}/V_T], \quad (16)$$

$$I_4 = n \cdot I_s \exp[V_{BE4}/V_T], \quad (16')$$

Thus, $$I_1/I_4 = n \cdot \exp[V_d/V_T], \quad (17)$$

$$I_2/I_3 = n^{-1} \cdot \exp[V_d/V_T], \quad (17')$$

wherein $V_d$ represents the differential input voltage, $V_{BE1}$, $V_{BE2}$, $V_{BE3}$ and $V_{BE4}$ representing the base-emitter voltages of transistors $Q_1$, $Q_2$, $Q_3$ and $Q_4$ respectively, $I_s$ denoting the reverse saturation current, and $V_T$ denoting the thermal voltage, i.e., kT/q.

Eliminating the variables except for $I_o$, $I_g$ and $V_d$ from equations (6) to (11') leads to the equation $$I_o = \left[ \frac{1}{1+n^{-1}\exp(-V_d/V_T)} + \frac{1}{1+n\exp(-V_d/V_T)} - 1 \right] \cdot I_g \quad (18)$$

Now, we express equation (12) in power series of $V_d$ and ignore the higher order terms. Then, $$I_o = [I_o]_{V_d=0} + [\delta I_o/\delta V_d]_{V_d=0} V_d. \quad (19)$$

Since $[\delta I_o/\delta V_d]_{V_d=0}$ is a transconductance G by definition, and $[I_o]_{V_d=0}=0$, it follows that $$I_o = G V_d, \quad (20)$$

wherein $$G = [2n/(1+n)^2] \cdot (I_g/V_T) \quad (21)$$

The above argument holds in each of the two OTAs which make up the gyrator circuit.

Next, we will set forth a temperature-compensation characteristic of the demodulator circuit of the present embodiment.

While the stabilized current supply represented in FIG. 8 above is of known art, it serves, when combined with the gyrator circuit of the present invention, to stabilize the transconductance G of each of the OTAs against a temperature variation for the reason described below.

Suppose that the ratio of the emitter area of the third transistor (to the emitter of which the regulating resistor R5 is connected) to the emitter areas of the current-source transistors of the OTAs be m and the output current of the stabilized current supply be $I_g$. Then $I_g$ is given as follows:

$$I_g = I_s (V_T/R) \cdot m^{-1} \ln m. \quad (22)$$

Accordingly, $$(1/I_g)(\delta I_g/\delta T) = (1/V_T)(\delta V_T/\delta T). \quad (23)$$

On the other hand, from equation (15) it follows that $$(1/G)(\delta G/\delta T) = (1/I_g)(\delta I_g/\delta T) - (1/V_T)(\delta V_T/\delta T) \quad (24)$$

Substituting equation (23) into equation (24) yields $$\delta G/\delta T = 0, \quad (25)$$

representing that thermal variations of the transconductances in both of the OTAs is compensated for at the same time by the thermal variation of the output current of the stabilized current supply.

Figure 10:
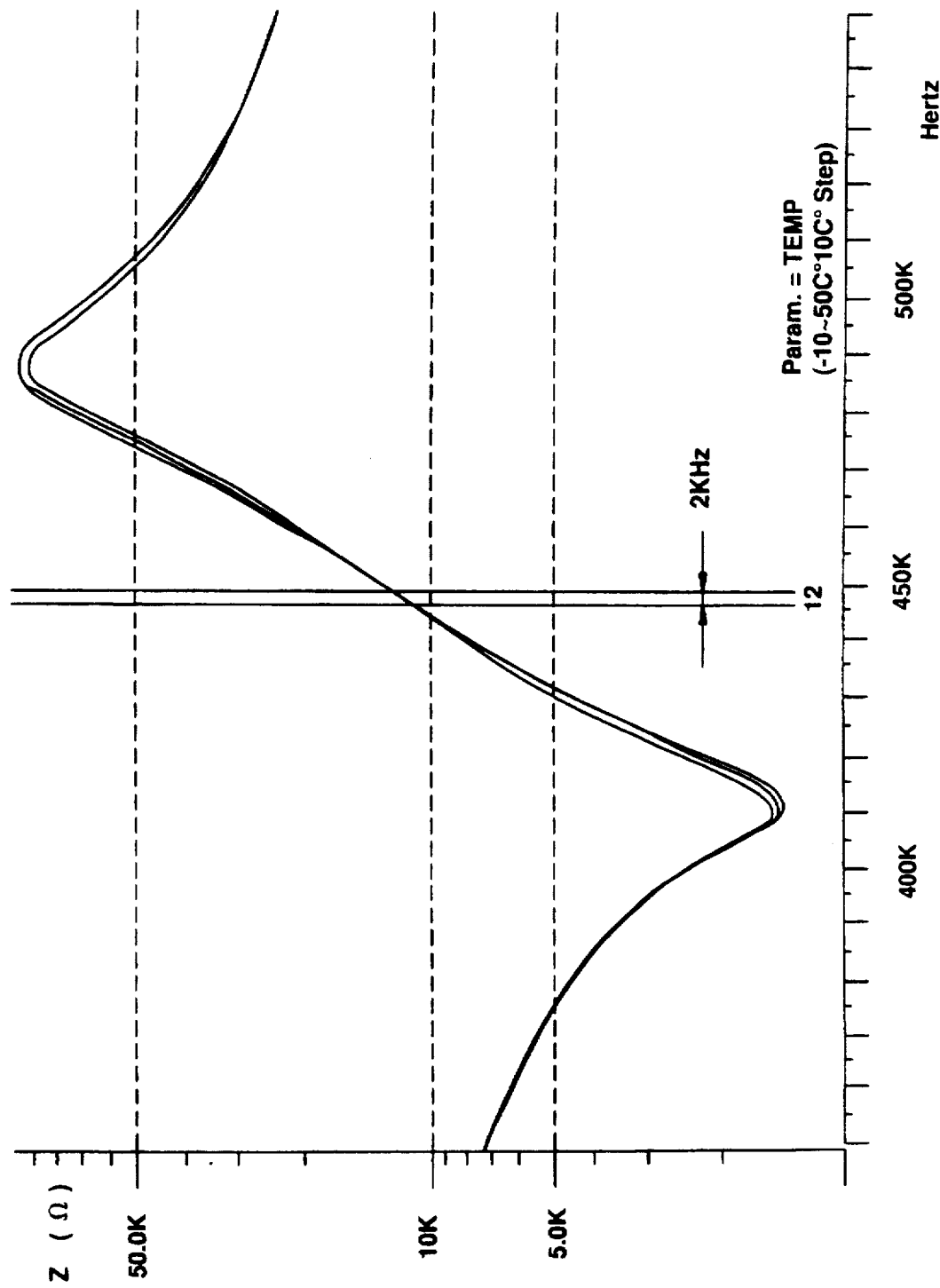
FIG. 10 represents a temperature dependence of the input impedance of the gyrator circuit shown in FIG. 8 plotted against frequency.

FIG. 10 represents a temperature dependence of the input impedance of the gyrator circuit shown in FIG. 8 plotted against frequency.

The figure shows that the temperature variation from −10° C. to 50° C. causes a shift of the impedance characteristic by 2 KHz, i.e., ±1 KHz with respect to the center frequency of 450 KHz. For comparison, in the prior art LC resonance circuit utilizing the gyrator circuit shown in FIG. 2, the shift of the input impedance characteristic was 30 KHz, i.e., ±15 KHz.

Accordingly, it is known from FIG. 10 that the resonance frequency of the resonance circuit of the present invention will be little influenced by temperature variation, exhibiting a quite stable characteristic.

Furthermore, it is known that the phase of the input impedance of the resonance circuit of FIG. 8 is approximately 65 degrees, showing remarkable improvement compared to 37 degrees of the prior art resonance circuit.

Since the frequency variation versus temperature variation of an ordinary resonance circuit in which a ceramic element is employed as a capacitor element is approximately ±1.5 KHz for the above-described range of temperature variation, there is no problem practically to use the LC resonance circuit according to the present invention.

Figure 11:
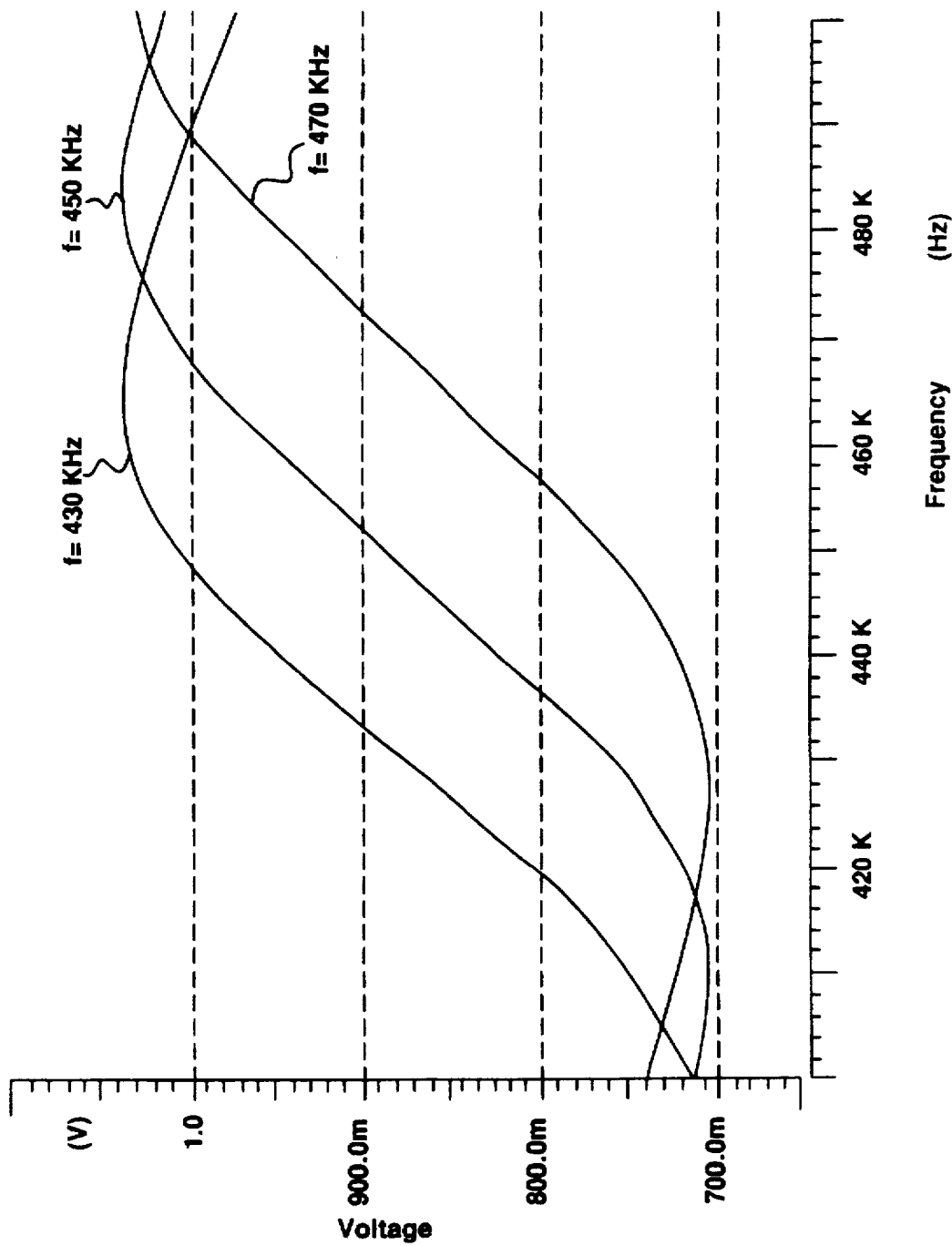
FIG. 11 represents the output voltage versus frequency characteristic of the demodulator circuit in which the gyrator circuit according to the present invention is employed.

FIG. 11 represents the output voltage versus frequency characteristic of the demodulator circuit in which a gyrator circuit according to the present invention is employed.

The figure shows three curves corresponding to intermediate frequencies f=430 KHz, 450 KHz and 470 KHz. The resonance frequency of the resonance circuit was varied by controlling the current supplied to the gyrator circuit as is the case of the gyrator circuit of prior art.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A demodulator circuit using a gyrator circuit, comprising:

a gyrator circuit having a first operational transconductance amplifier and a second operational transconductance amplifier, wherein a second input terminal of the first operational transconductance amplifier is connected to a first output terminal of the second operational transconductance amplifier; a second output terminal of the first operational transconductance amplifier is connected to a second input terminal of the second operational transconductance amplifier, both said second input terminal of the first operational transconductance amplifier and said second input terminal of the second operational transconductance amplifier being grounded via a constant dc voltage; a first output terminal of the first operational transconductance amplifier is connected to a first input terminal of the second operational transconductance amplifier; and a capacitor is connected between said first and second output terminals of the first operational transconductance amplifier; a first input terminal of the first operational transconductance amplifier being connected to a second output terminal of the second operational transconductance amplifier and serving as an input terminal to the gyrator circuit; and the capacity C of the capacitor being determined so that $$C=LG^2,$$

where L stands for a desired equivalent inductance of the gyrator circuit as viewed from the input terminal thereof and G stands for the transconductance of each of the operational transconductance amplifiers employed in the gyrator circuit, and a demodulating circuit having a bridge circuit, EX-NOR gate means for extracting in-phase signal components from the signals present at the output nodes of the bridge circuit and integrating means for averaging the output of said EX-NOR gate means, wherein a first arm of said bridge circuit is a first resistor, a second arm is made up of a resonance circuit with said gyrator circuit used as an inductor, a third arm is a second resistor and a fourth arm is a third resistor with one end being grounded for an ac voltage component, an incoming signal to be demodulated being applied across the node connecting the first and third arms and the ground potential, and the output nodes of the bridge circuit being the node connecting the first and second arms and the node connecting the third and fourth arms.

2. A demodulator circuit as claimed in claim 1, combined with stabilized current supply means, wherein each of the operational transconductance amplifier includes a dual differential amplifier having a first and a second differential amplifier each of which has differential transistors of a first conduction type:

the emitters of said differential transistors of each differential amplifier being connected together to a collector of a current-source transistor of the first conduction type; a first of the differential transistors in the first differential amplifier having a base and a collector connected with a base and a collector, respectively, of a first of the differential transistors in the second differential amplifier, the connected bases acting as said first input of the operational transconductance amplifier and the connected collectors being connected with a first load transistor of the second conduction type to act as said second output of the operational transconductance amplifier; and a second of the differential transistors in the first differential amplifier having a base and a collector connected with a base and a collector, respectively, of a second of the differential transistors in the second differential amplifier, the connected bases of the second differential transistors in both of the differential amplifiers acting as said second input of the operational transconductance amplifier and the connected collectors of the second differential transistors in both of the differential amplifiers being connected to a second load transistor of the second conduction type to act as said first output of the operational transconductance amplifier, and wherein said stabilized current supply means comprises:

a first transistor of a first conduction type, and a second transistor of a second conduction type serially connected to said first transistor, a third transistor of said first conduction type, and a fourth transistor of said second conduction type serially connected to said third transistor, the emitter of said third transistor being connected to one end of a current-regulating resistor, said first transistor being diode-connected, the collector of the diode-connected first transistor being connected to the base of said third transistor, said fourth transistor being diode-connected, the collector of the diode-connected fourth transistor being connected to the base of said second transistor, the resistance of the resistor being determined so that an arbitrarily selected one of the operational transconductance amplifiers has an optimum transconductance for realizing an intended inductance of the gyrator circuit, and the collector current of said third and fourth transistor being transferred through a current mirror circuit to said current-source transistors of said operational transconductance amplifiers.

3. The demodulator circuit as claimed in claim 2, further provided with a first transfer circuit and a second transfer circuit both for transferring a current produced by said stabilized current supply means, and a current amplifier circuit for stabilizing a current in said demodulator circuit, wherein said first transfer circuit is made up of a fifth transistor of the second conduction type with a base connected to the base of said fourth transistor and a diode-connected sixth transistor of the first conduction type serially connected to the fifth transistor.

said second transfer circuit is made up of a seventh transistor of the first conduction type with a base connected to the base of the diode-connected sixth transistor and also with a first base line connecting the bases of said current-source transistors in said operational transconductance amplifiers, and an eighth transistor of the second conduction type with a base connected to a second base line connecting the bases of said load transistors of said operational transconductance amplifiers, said eighth transistor being serially connected to said seventh transistor, and said current amplifier circuit comprising a differential amplifier made up of a first transistor and a second transistor of the first conduction type with the emitters of both transistors coupled to an regulated current supply, said first transistor having a base coupled to a reference voltage and a collector connected to a collector of a first load transistor of the second conduction type to provide an output of the differential amplifier, and said second transistor having a base connected to the collector of said eighth transistor to provide a negative feedback path, and also having a collector connected to a diode-connected second load transistor of the second conduction type, the collector of the second load transistor connected to the base of the first load transistor to provide a negative feedback path for stabilizing the differential amplifier, a phase compensating circuit connected between said output of the differential amplifier and the collector of the eighth transistor to prevent undesirable oscillation of the gyrator circuit, and said output of the differential amplifier being connected to the base of the eighth transistor.

* * * * *